United States Patent [19]

Pribat et al.

[11] Patent Number: 5,053,833

[45] Date of Patent: Oct. 1, 1991

[54] DEVICE MADE OF OXIDE SUPERCONDUCTIVE MATERIAL COVERED WITH ION CONDUCTIVE MEANS FOR ADJUSTING THE DOPING LEVEL AND $T_c$ THEREOF

[75] Inventors: Didier Pribat, Paris; Dominique Dieumegard, Mareil-Marly; Guy Garry, Reil Malmaison; Louis Mercandalli, Montgeron, all of France

[73] Assignee: Thomson-CSF, Paris, France

[21] Appl. No.: 657,364

[22] Filed: Feb. 19, 1991

Related U.S. Application Data

[63] Continuation of Ser. No. 299,444, Jan. 23, 1989, abandoned.

[30] Foreign Application Priority Data

Jan. 22, 1988 [FR] France .................. 88 00682

[51] Int. Cl.$^5$ ............ H01L 27/12; H01L 45/00; H01L 49/02
[52] U.S. Cl. ............................. 357/4; 505/1; 505/816; 29/527.2
[58] Field of Search ............ 505/1, 816, 731; 357/52, 4, 5; 427/62; 29/527.2

[56] References Cited

U.S. PATENT DOCUMENTS

| | | | |
|---|---|---|---|
| 4,892,862 | 1/1990 | Ogushi et al. | 505/731 |
| 4,955,135 | 9/1990 | Pinkhasov | 29/527.2 |

FOREIGN PATENT DOCUMENTS

| | | |
|---|---|---|
| 0100251 | 2/1984 | European Pat. Off. |
| 0122822 | 10/1984 | European Pat. Off. |
| A1513897 | 1/1968 | France |
| 63-261623 | 10/1988 | Japan |
| 1-56354 | 3/1989 | Japan |

OTHER PUBLICATIONS

S. R. Ovshinsky et al., "Superconductivity at 155° K.", *Physical Review Letters* (6/15/87), vol. 58, No. 24, pp. 2579-2581.

M. Xian-Ren et al., "Zero Resistance at 148.5° K. in Fluorine Implanted YBaCuO compound", *Solid State Communications* (1987), vol. 64, No. 3, pp. 325-326.

F. Herman et al., *IBM Research Report* (6/23/87), RJ5712 (57691), "Electronic Structure of O-Deficient High $T_c$ Supercoductors: $YBa_2Cu_3O_x$ ($6 \leq X \leq 8$)".

I. Chen et al., "Superconductive $Al/YBa_2Cu_3O_x$ composites stabilized by O/F donors" (4/18/88), *Appl Phys. Lett.*, vol. 52, No. 16, pp. 1355-1357.

H. Zhang et al., "Phase and Superconductivity of SrBaYCuFO System", *Solid State Communications* (1988), vol. 66, No. 3, pp. 291-294.

Chem. Abs., vol. 70, 1969, p. 494, Abstract No. 83671p, "Electrodes for high-temp. fuel cells with a solid electrolyte".

Japapanese Journal of Applied Physics, vol. 26, No. 4, Apr. 1987, pp. L410-L412, Tokyo, JP; S. Nagata et al.

Annales De Chimie Francaises, vol. 3, 1978, pp. 279-285, Paris, FR; C. Lucat et al.

Solid State Communications, vol. 64, No. 3, 1987, pp. 325-326, Pergamon Journals Ltd, Oxford, GB; M. Xi-an-Ren et al.

*Primary Examiner*—Andrew J. James
*Assistant Examiner*—D. N. Russell
*Attorney, Agent, or Firm*—Oblon, Spivak, McClelland, Maier & Neustadt

[57] ABSTRACT

Disclosed is a device made of superconductive material wherein the superconducting layer is enclosed by at least one material which is a conductor of ions of one of the anionic constituent elements of the superconductive layer. This makes it possible to adjust the stoichiometry of the superconductive layer. The disclosure also concerns a method for adjusting the content of the constituent elements of the superconductive layer by electrolysis.

9 Claims, 2 Drawing Sheets

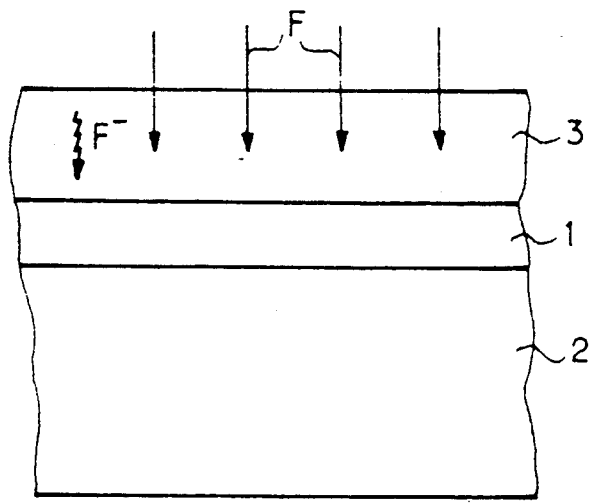
FIG_1
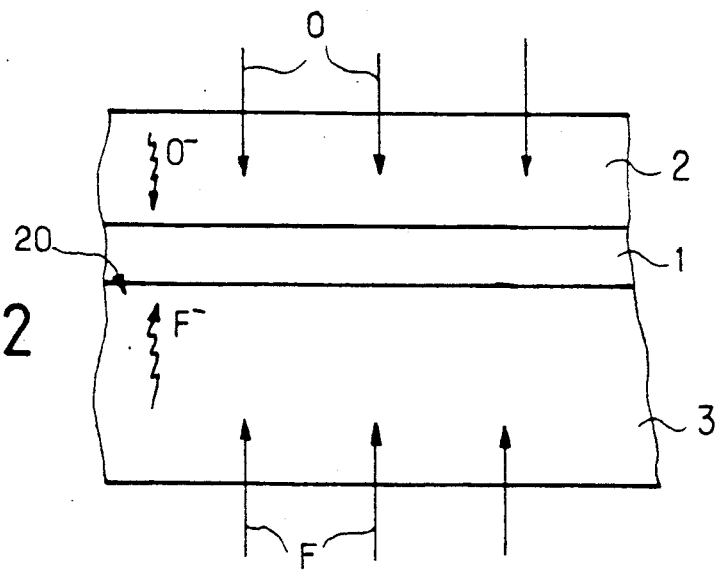
FIG_2
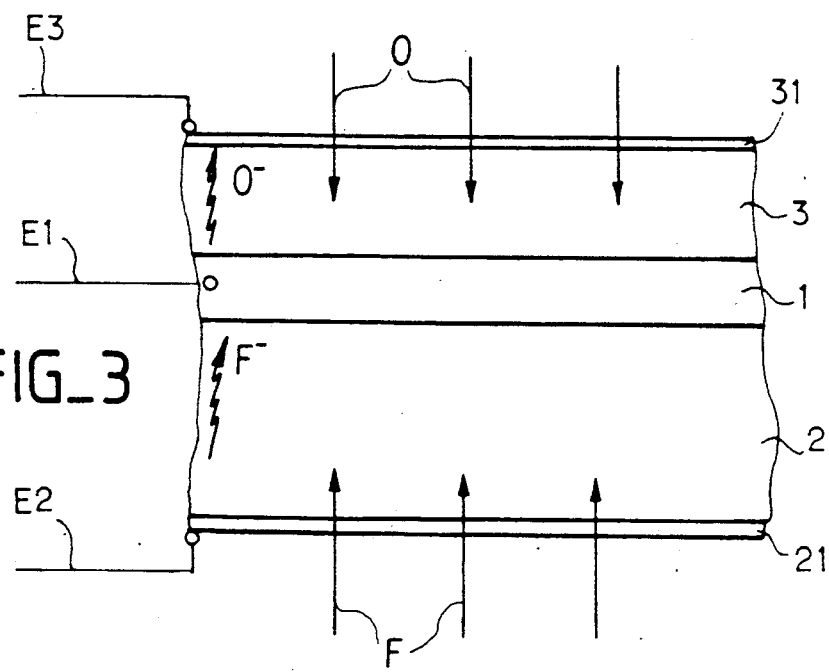
FIG_3

FIG_4
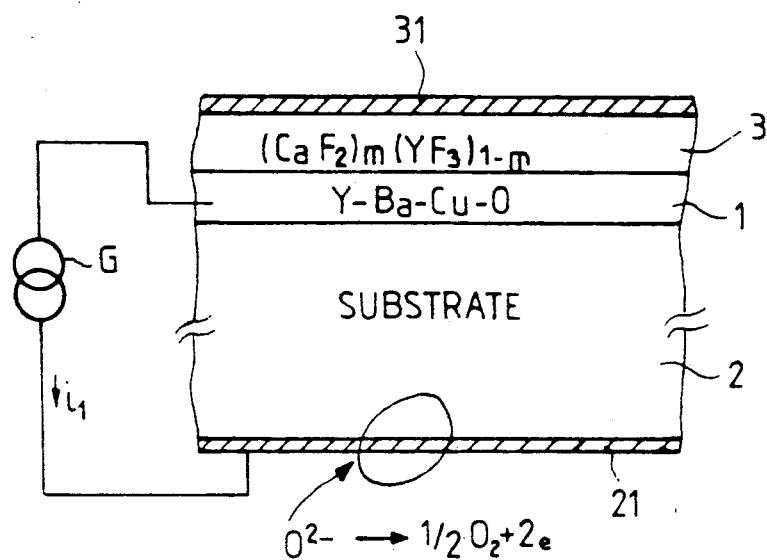
FIG_5
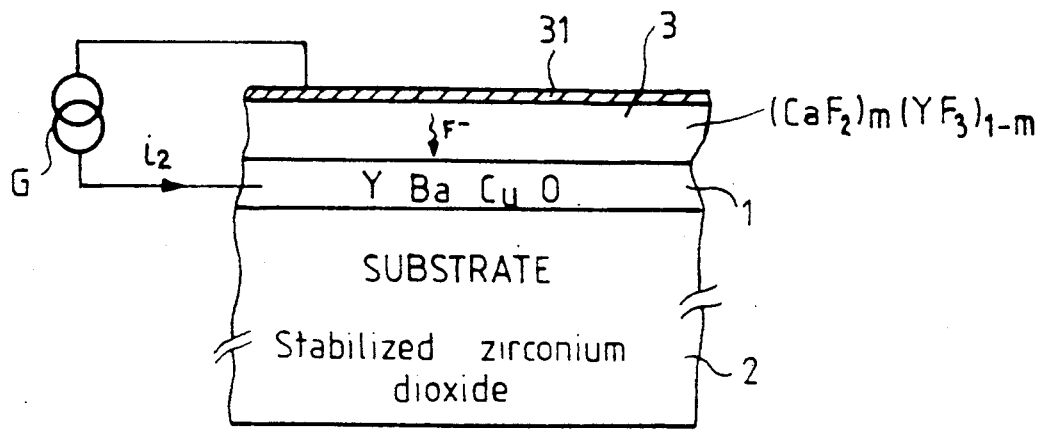

DEVICE MADE OF OXIDE SUPERCONDUCTIVE MATERIAL COVERED WITH ION CONDUCTIVE MEANS FOR ADJUSTING THE DOPING LEVEL AND T$_c$ THEREOF

This application is a continuation of application Ser. No. 07/299,444, filed on Jan. 23, 1989, now abandoned.

BACKGROUND OF THE INVENTION

1. Field of the Invention

The invention concerns a superconductive material and the method of its manufacture and, more particularly, the making of devices with thin films of superconductive materials having high critical temperatures.

More precisely, the invention concerns a structure which enables precise control over certain constituents of the superconductive material. For example, the invention enables precise control over the oxygen or fluorine content of a superconductive material of the type Y—Ba—Cu—O—F.

2. Description of the Prior Art

Since the discovery, in 1986, of the superconductivity, at 30 K, of the compound $La_{2-x}Ba_xCuO_{4-y}$, by BEDNORZ and MULLER (Z. Phys. B.64. 189.1986), the achieved critical temperature of superconductive oxides has been constantly rising. This is the result of an unprecedented degree of mobilization of the international scientific community. Thus, the new compounds of the system Y—Ba—Cu—O now have a critical temperature of the order of 95 K. It must be noted that, with the compound studied by BEDNORZ and MULLER, only the substitution of lanthanum has enabled the critical temperature to be raised to 95 K. The manipulation and replacement of the other metal cations have had no effect to date.

More recently, the replacement of a part of the oxygen by fluorine has enabled the critical temperature in the system Y—Ba—Cu—O—F, to be further raised to about 150 K (cf. article by S. R. OVSHINKSY et al in "Physical Review Letters", 15th June 1987, p. 2579, and also article by MENG XIAN-REN et al in "Solid State Communications", vol. 64, No. 3, 1987, p. 325.

However, the observed phenomenon of loss of resistivity does not appear to be reproducible and, for reasons as yet unexplained, this phenomenon disappears after a few cycles of temperature between the ambient temperature and that of liquid nitrogen (see article by MENG XIAN-REN et al referred to above).

Furthermore, the exact anionic composition leading to the appearance of the high-temperature superconductivity of oxyfluoride is difficult to obtain. This phenomenon has already been observed in the oxides of the system Y—Ba—Cu—O as described in the French patent application No. 87 09463 of 3rd July 1987. Thus, it is observed that the superconductive properties are highly dependent on the oxygen and fluorine content of the material.

The method according to the invention can be used, firstly, to obtain stable, thin layers of superconductive oxyfluoride Y—Ba—Cu—O—F and, secondly, to adjust their oxygen and fluorine composition with precision.

More generally, an object of the invention is a device made of superconductive material, the structure of which enables the content of each of the anionic elements of the superconductive material to be fixed with precision, as well as a method which, by means of a structure of this type, can be used to achieve this precision.

SUMMARY OF THE INVENTION

The invention therefore concerns a device made of a superconductive material, wherein said superconductive material, or material designed to be superconductive, is overlaid by at least one first material which conducts ions of at least one constituent element of the superconductive material and does not conduct oxygen ions.

The invention also concerns a method for making a device of superconductive material, said method comprising the following steps:

a first step for making a layer of superconductive material, or material designed to be superconductive, on a substrate of a first material;

a second step for making an overlaying layer of a second material on the layer of superconductive material, or material designed to be superconductive;

a third step for the passage of ions from one of the anionic constituents of the superconductive material through the first or second material or through both of them.

BRIEF DESCRIPTION OF THE DRAWINGS

The various objects and characteristics of the invention will appear more clearly from the following description, given by way of example, with reference to the appended figures of which:

FIG. 1 shows an exemplary embodiment of the device of the invention, wherein a layer of superconductive material, or material designed to be superconductive, is disposed and confined between two other contacting layers, at least one of which is a conductor of ions of a constituent element of the superconductive material;

FIG. 2 shows an alternative embodiment of the device of the invention; of the invention, fitted with electrical connections;

FIG. 3 shows an exemplary embodiment of the device of the invention, fitted with electrical connections;

FIGS. 4 and 5 show examples of the carrying out of the electrolysis steps forming part of the method of the invention.

DETAILED DESCRIPTION OF THE INVENTION

Referring to FIG. 1, we shall first of all describe a general exemplary embodiment of the device according to the invention.

The device has a layer of a superconductive material 1, or material designed to be superconductive, enclosed between two layers 2 and 3.

According to the simplified embodiment shown in FIG. 1, one of the materials, that of the layer 2 for example, is a conductor of ions of one of the constituent elements, notably anionic, of the superconductive material of the layer 1 to be obtained. The material, of the other conductor 3 is not an ion conductor. Anion transport can thus occur through the layer 2. For example, to obtain a superconductive material of the type Y—Ba—Cu—O—F, the layer 2 could be a conductor of fluorine ions, as shown in FIG. 1, to make it possible to optimize the fluorine content of the layer 1, in order to obtain a determined critical temperature.

According to another embodiment, these materials of the layers 2 and 3 are both chosen so as to enable the conduction of ions of one of the constituent elements, notably anionic, of the superconductive material.

In contrast, these layers prevent any atomic or molecular diffusion of the constituent elements of the layer of superconductive material 1. The layer 1 is therefore confined from the molecular and atomic points of view.

The two layers 2 and 3 can be made with the same material, so as to enable the diffusion of one and the same type of ions. For example, for a superconductive material of the type Y—Ba—Cu—O—F, the material of the layers 2 and 3 may be a conductor of fluorine ions, thus providing, through ion transport of fluorine through the layers 2 and 3, for the optimization of the fluorine content of the layer 1 in order to modify the critical temperature of the superconductive material.

However, these exemplary embodiments entail the assumption that only the content of one constituent element needs to be adjusted, the content of the other constituent elements having already been fixed.

According to a more complete, exemplary embodiment shown in FIG. 2, the layers 2 and 3 are made with different materials, each enabling an ionic diffusion of one particular type of ion. For example, in the case of a superconductive material of the type Y—Ba—Cu—O—F, one of the layers, the layer 2 for example, is a conductor of fluorine ions while the layer 3 is a conductor of oxygen ions. It is thus possible, by transport of ions (by electrolysis in particular), through the layer 3, to adjust the oxygen content of the superconductive layer 1, and then, through the layer 2, to adjust the fluorine content of the superconductive layer 1.

It is quite clear that, without going beyond the scope of the invention, that the nature of the layers 2 and 3 could be reversed: the layer 2 could then conduct oxygen and the layer 3 fluorine. Similarly, it is possible for either of the layers 2 and 3 to be conductors of ions of another constituent element of the layer 1.

According to the exemplary embodiment of FIG. 2, the layer 2 serves as a substrate and has a face 20 which supports the superconductive layer 1. This superconductive layer 1 is covered by the layer 3. However, it can also be provided that it is the layer 3 which serves as a substrate and has a face supporting the layer 1 covered by the layer 2.

FIG. 3 shows an embodiment in which porous electrodes, 21 and 31 respectively, are provided, on the external faces of the ion conducting layers 2 and 3. The electrode 21 lets through the molecules or atoms of the constituent elements for which the layer 2 is an ion conductor. Similarly, the electrode 31 lets through the molecules or atoms of the constituent element or elements for which the layer 3 is an ion conductor.

Electrical connections E1, E2 and E3 enable the superconductive layer 1 and these electrodes 21 and 31, respectively, to be connected to an electrical generator (not shown) which is necessary for electrolysis, enabling ion transport through the layers 2 and 3.

For example, an oxygen conducting layer will be made, based on:

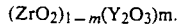

$(ZrO_2)_{1-m}(Y_2O_3)_m$.

Again, by way of example, a fluorine conducting layer will be made, based on:

$(CaF_2,$ or else $Ca_{1-x}Y_xF_{2+x})$

The porous electrodes are made, for example, with a gold or platinum base.

According to the invention, the superconductive layer 1 thus lies between layers of two materials that are conductors of either fluorine or oxygen ions. It is thus easy to adjust and check the oxygen and fluorine composition of this layer in using the transport properties of the solid electrolytes in question.

The properties by which oxygen, in the form of $O^{-2}$ ions, is transported in stabilized zirconium dioxides (in thin layers or in the form of massive materials) as well as certain applications using the growth or reduction of oxide of semiconductors have been described in the following French patent applications:

no. 82.11215 (Michel CROSET, Michel MERCANDALLI) concerning a a method for the reduction of compounds in layers on a substrate and application thereof to the fabrication of a field-effect semiconductor structure.

no. 83.04051 (Michel CROSET, Dominique DIEUMEGARD, Didier PRIBAT) concerning a method for the fabrication of a semiconductor device of the type comprising at least one layer of silicon on an insulating substrate.

As an example, a possible mechanism for oxygen enhancement or depletion of the superconductive layer may be derived from the article by D. PRIBAT, L. M. MERCANDALLI, J. SIEJKA and J. PERRIERE in Journal of Applied Physics , Vol. 58, No. 1, 1st July 1985.

With regard to the properties of the transport of fluorine ions in fluorinated, solid electrolytes, there are a number of references in current literature (see, for example, L. E. NAGEL and M. O'KEEFFE in M. VAN GOOL ed. "Fast Ion Transport in Solids" North Holland, Elsevier, 1973, p. 165; J. M. REAU et al , "Journal of Solid State Chemistry", 17, 1976, p. 123; C. LUCAT et al ., "Annales de Chimie", 3, 1978, p. 279; K. E. D. WAPENAAR and J. SCHOONMAN, "Journal of the Electrochemical Society", 126. 4. 1979, p. 667; C. LUCAT et al ., "Journal of Solid State Chemistry", 29, 1979, p. 373). In particular, for the compound $Ca_{1-x}Y_xF_{2+x}$, the ion conduction for $(0.06 < x < 0.25)$ seems to be associated with the presence of fluorine voids in the anionic sub-lattice (see LUCAT et al cited above). The ion conductivity of this compound can be written in the form:

$$\sigma = \sigma_o \exp - E_1/kT$$

(where $\sigma_0$ is a constant, $E_i$ is the activation energy, k is the Boltzmann constant and T is the absolute temperature) and, at 650° C., this ionic conductivity is equal to about $10^{-2}$ $(\Omega cm)^{-1}$ for $x=0.25$. Moreover, the solid solutions $CaF_2 + YF_3$ are thermodynamically very stable: this enables them to be used up to temperatures of the order of 1000° C. in oxidizing or reducing atmospheres.

We shall now describe an example of a method for making the device of the above described invention.

In a first step, a thin film 1 of material Y—Ba—Cu—O—F is deposited on a substrate 2 which is a conductor of oxygen ions (stabilized zirconium dioxide or stabilized albanite type). This layer is typically deposited either by cathode sputtering (with a single or multiple target cathode system) or by evaporation under electron bombardment (with a single source or a multiple source system) or, again, by a molecular beam epitaxy type of technique or by CVD type vapor phase growth or by any other appropriate method.

In a second step, a thin film 3, which is a conductor of fluorine ions ($CaF_2$ doped by means of $YF_3$), is deposited on the previous thin layer 1).

This deposition will be done by the techniques (for example, cathode sputtering, vacuum deposition, etc.) known to those skilled in the art. The thickness of this thin layer will typically range between 0.1 micron and a few microns.

During a third step, a first porous electrode 31 made of gold or platinum is deposited on the fluorine conducting thin layer 3.

During a fourth step, the superconductive layer is reduced by transport of oxygen ions through the stabilized zirconium dioxide substrate. This operation can be done thermally, by placing the structure in a reductive atmosphere at 800°–900° C.

During a fifth step, all or a part of the oxygen, previously removed is replaced by fluorine, by forcing a current of ions $F^-$ to pass through the fluorine ion conducting electrolyte (based on $CaF_2$ for example) using, for example, a plasma source, the structure being heated to between 150° and 600° C.

This fifth step is performed, as shown in FIG. 5, by means of a generator G connected between the electrode 31 and the superconductive layer 1.

The plasma source will be made, for example, in a vacuum chamber evacuated to $10^{-2}$ Torrs and fed with $CF_4$ or any other fluorinated gas capable of giving a source of ions $F^-$. The electromagnetic excitation will be transmitted by means of an inductive or capacitive coupling.

During a sixth step, the fluorine injected in a controlled way in the superconductive layer is redistributed, if necessary, by heat treatment at a temperature ranging between 500° C. and 900° C., with the upper, solid, electrolyte layer stopping the exodiffusion of all the species (anions and cations).

According to a variant of the method of the invention, the third step may include the making, on the substrate 2, of a second porous electrode 21, made of gold or platinum. The structure obtained is as shown in FIG. 3.

In this case, the preceding fourth step is accomplished electrochemically, by forcing a current to flow through the substrate 1 (made of zirconium dioxide for example), instead of thermally. This fourth step is then performed according to FIG. 4, using a generator G connected between the electrode 21, made during the third step (see above paragraph), and the layer of superconductive material 1. During this step, the entire structure is preferably carried to a temperature ranging between 200° C. and 800° C. The fifth and sixth steps of the method are then carried out as described above.

The description of the above steps is based on a configuration using a substrate 2 which is a conductor of oxygen ions and a layer 3 which is a conductor of fluorine ions. It is quite clearly possible to choose a structure where the different layers are deposited on a substrate which is a conductor of fluorine ions.

The above-described method provides for a reduction in the oxygen of the superconductive material, and then an addition of fluorine. However, it is also possible to perform an oxidation and/or reduction operation on the superconductive material followed by an addition of fluorine or any other method of electrolysis.

The invention therefore consists in the making of a multilayered structure in which the layer of superconductive material of a Y—Ba—Cu—O type is first deposited (by means known to those skilled in the art) on a substrate which is a conductor of oxygen ions (for example, stabilized zirconium dioxide with yttrium oxide or calcium oxide, stabilized ceria with yttrium oxide, etc.): then, on the superconductive layer Y—Ba—Cu—O, there is deposited a thin film 3 of a material which is a conductor of ions of another constituent element such as fluorine for example (fluorspar, fluorspar doped with yttrium fluoride, strontium difluoride, etc.) and finally, an electrode made of gold or platinum is deposited on the thin film 3 so that it is possible to polarize the solid electrolyte which is a conductor of fluorine (in the form of ions $F^-$). The method of the invention thus makes it possible, by electrolysis through the substrate 2 and the layer 3, to achieve an oxidation and/or reduction operation and an addition of another constituent element in the superconductive layer, thus enabling an increase in the critical temperature towards 150 K.

It is quite clear that the above description has been given purely as a non-restrictive example. Other variants can be envisaged without going beyond the scope of the invention. In particular, it is possible to envisage the deposition, on the substrate (oxygen ion conductor for example), of a layer of material Y—Ba—Cu—O—F and the performance, after the enclosing of this layer, by means of a material which is a conductor of fluorine ions, of the oxidation and/or reduction operations concerning the two anionic species so as to carry the material Y—Ba—Cu—O—F to the exact, high-temperature, superconductive composition. The numerical values have been given purely in order to illustrate the description. Besides, the application of the invention to a structure enabling conduction of oxygen and fluorine ions has been given purely as an example. The invention can also be applied, on a general basis, to a structure enabling any other ionic conduction.

We claim:

1. A device comprising a metal oxide superconductive material, constituted of elements including oxygen in the shape of a first body having two opposing surfaces and lying over one of said surfaces a first confining material which conducts fluorine anions and does not conduct oxygen anions and lying over the other of said surfaces a second confining material which is an oxygen anion conductor.

2. A device comprising superconductive material or material designed to be superconductive, according to claim 1, wherein the first material is a fluorine ion conductor, and fluorine is an element of the superconducting material.

3. A device comprising a metal oxide superconductive material, constituted of elements including oxygen in the shape of a first body having two opposing surfaces and lying over one of said surfaces a first confining material which conducts fluorine anions and does not conduct oxygen anions and lying over the other of said surfaces a second confining material which does not conduct ions.

4. A device comprising superconductive material according to claim 1, wherein the second material is the substrate of the device and wherein it has a face on which the superconductive material is located in the form of a layer, said layer of superconductive material being covered by a layer of the first material.

5. A device comprising superconductive material according to claim 1, wherein the first material is the substrate of the device and wherein it comprises a face on which the superconductive material is located, in the form of a layer, said layer of superconductive material being covered by a layer of the second material 6. A device comprising superconductive material according to claim 2, wherein the first material is fluorspar based.

7. A device comprising superconductive material according to claim 2, wherein the second material is based on stabilized zirconium oxide.

8. A device comprising superconductive material according to claim 1, wherein each ion conducting layer is in contact with a porous, metallic electrode and electronic connections for the connection of a current source enabling an electrolysis of the device.

9. A device comprising superconductive material according to claim 8, wherein each metallic electrode which is a conductor of the ions of a determined, constituent element of the superconductive material, is permeable to the molecules or atoms of the determined, constituent element.

* * * * *